United States Patent
Melanson (10) Patent No.: US 9,425,817 B1
(45) Date of Patent: Aug. 23, 2016

(54) HIGH ORDER CORRECTION FOR PULSE WIDTH MODULATION (PWM) DIGITAL/ANALOG CONVERTERS WITH REDUCED COMPUTATION

(71) Applicant: Cirrus Logic International Semiconductor Ltd., Edinburgh (GB)

(72) Inventor: John L. Melanson, Austin, TX (US)

(73) Assignee: CIRRUS LOGIC INTERNATIONAL SEMICONDUCTOR LTD., Austin, TX (US)

( * ) Notice: Subject to any disclaimer, the term of this patent is extended or adjusted under 35 U.S.C. 154(b) by 0 days.

(21) Appl. No.: 14/946,684

(22) Filed: Nov. 19, 2015

(51) Int. Cl.
  *H03M 3/00* (2006.01)
(52) U.S. Cl.
  CPC .............. *H03M 3/358* (2013.01); *H03M 3/36* (2013.01); *H03M 3/424* (2013.01)
(58) Field of Classification Search
  CPC .......................................... H03M 3/358–3/364
  USPC .......................................................... 341/143
  See application file for complete search history.

(56) References Cited

U.S. PATENT DOCUMENTS

| | | | |
|---|---|---|---|
| 5,548,286 A | 8/1996 | Craven | |
| 5,784,017 A | 7/1998 | Craven | |
| 5,815,102 A | 9/1998 | Melanson | |
| 6,150,969 A * | 11/2000 | Melanson | G06F 1/025 |
| | | | 341/143 |
| 6,480,129 B1 * | 11/2002 | Melanson | H03M 7/3013 |
| | | | 341/138 |
| 7,928,876 B2 * | 4/2011 | Thomsen | H03M 3/484 |
| | | | 341/143 |
| 2016/0072520 A1 * | 3/2016 | Pagnanelli | H03M 3/468 |
| | | | 341/143 |

FOREIGN PATENT DOCUMENTS

WO     9737433 A1    10/1997

OTHER PUBLICATIONS

Chian C. Ho and Chung J. Kuo; Oversampling Sigma—Delta Modulator Stabilized by Local Nonlinear Feedback Loop Technique;IEEE Transactions on Circuits and Systems—II: Analog and Digital Signal Processing, vol. 47, No. 9, Sep. 2000.*

* cited by examiner

*Primary Examiner* — Howard Williams
(74) *Attorney, Agent, or Firm* — Norton Rose Fulbright US LLP (57) ABSTRACT

A delta sigma modulator (DSM) may be improved by configuring it to set the high-order nonlinear function values to zero when the quantization value being output is at its minimum or maximum value. In one embodiment, a DSM may include at least a quantizer having an input responsive to one of two state variables of the DSM and providing a feedback signal and a modulator output signal. The DSM may also include two mutually nonlinear function blocks, each applying a nonlinear function to the feedback from the quantizer, to form two mutually nonlinear feedback signals. At least one of the nonlinear functions applied by the function blocks may comprise a zero when the modulator output signal is a maximum modulator output signal capable of being output by the quantizer or when the modulator output signal is a minimum modulator output signal capable of being output by the quantizer.

13 Claims, 10 Drawing Sheets

HIGH ORDER CORRECTION FOR PULSE WIDTH MODULATION (PWM) DIGITAL/ANALOG CONVERTERS WITH REDUCED COMPUTATION

CROSS REFERENCE TO RELATED APPLICATIONS

This application is related to subject matter disclosed in U.S. Pat. Nos. 5,815,102 and 6,480,129, which are both hereby incorporated by reference.

REFERENCE TO COMPUTER PROGRAM LISTING APPENDIX

A computer program listing appendix is submitted herewith the Instant Application as the file correctionfactors.txt, which is hereby incorporated by reference.

FIELD OF THE DISCLOSURE

The present invention relates to correction techniques for delta sigma converters for audio digital to analog (D/A) and analog to digital (A/D) conversion applications.

BACKGROUND

Delta Sigma D/A and A/D converters have become the standard devices for data conversion in audio applications. The purpose of using Delta Sigma converters in audio applications is to predict and reduce in-band quantization error, which causes distortion, with feedback loops. A good overview of the theory of Delta Sigma data converters is given in the book "Delta Sigma Data Converters," by Norsworthy, Schreier, and Temes (IEEE Press, 1997).

Figure 1:
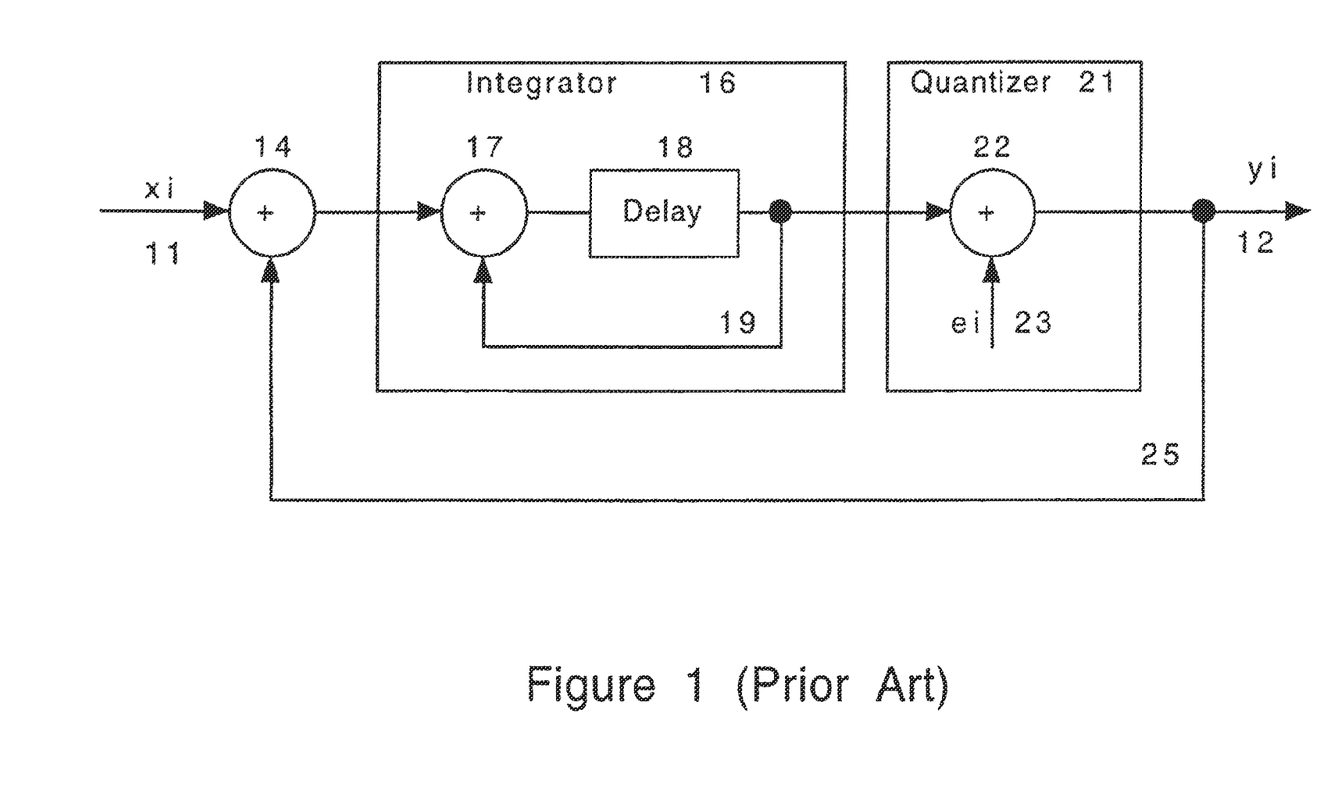
FIG. 1 (Prior Art) shows a well-known first-order delta sigma modulator.

U.S. Pat. No. 5,815,102 by the present inventor (incorporated herein by reference) teaches methods for correcting delta sigma quantizers to account for distortion introduced by PWM on the output. In FIG. 1 (taken from that patent), a typical first order delta sigma quantizer is shown. The purpose of this quantizer, in a D/A converter, is to convert a high resolution digital signal having several bits to a single bit representation which can be accurately converted to analog. Most delta sigma digital to analog designs operate in the normal sampled time domain, that is, with the assumption that all signals are sampled at a fixed frequency f, and the value at each sample represents an impulse response with a finite area and an infinitesimally small width. The invention taught in U.S. Pat. No. 5,815,102 used some generalizations of this assumption to include converters using output signals having variable pulse widths. One such application is noise shaped pulse width modulation (PWM).

Figure 2:
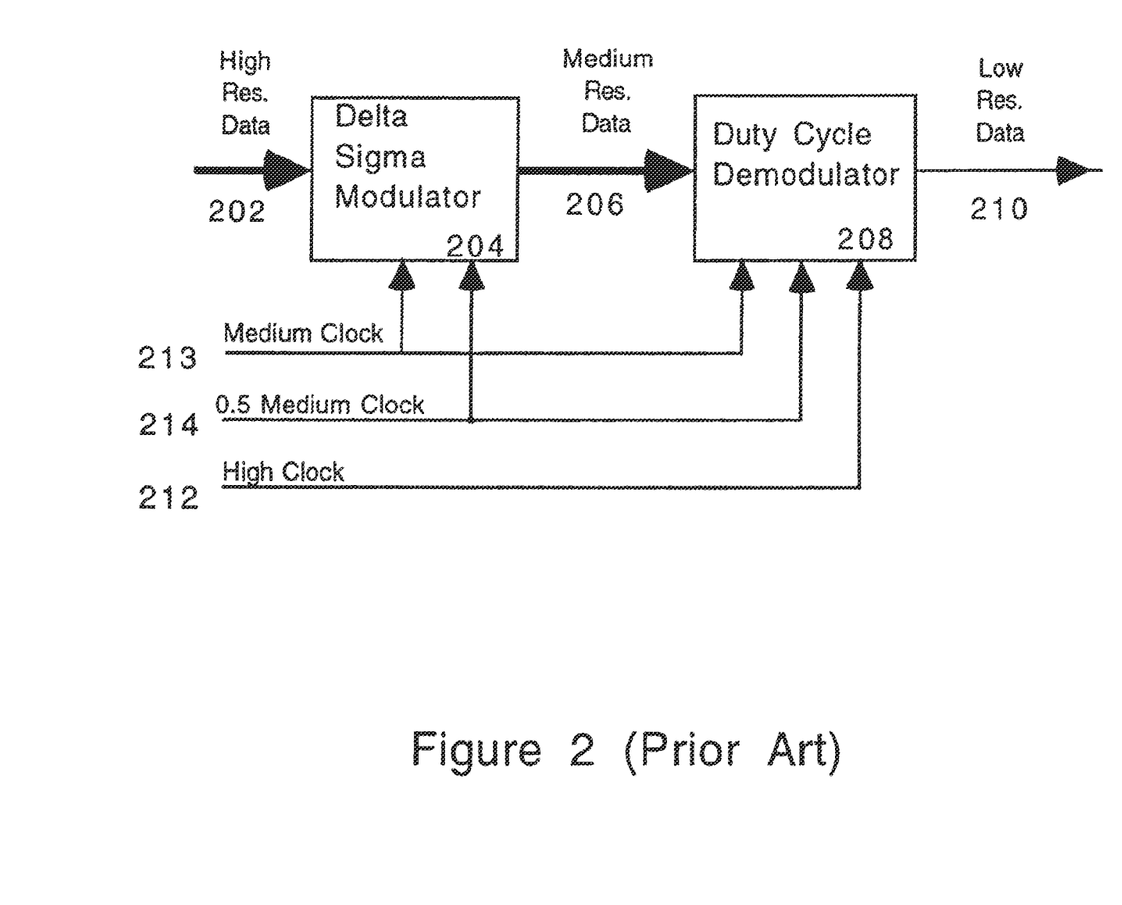
FIG. 2 (Prior Art) shows a demodulator including a delta sigma converter and a duty cycle demodulator.

FIG. 2, also taken from U.S. Pat. No. 5,815,102 shows a demodulator which might be used in an oversampling D/A converter. High resolution data 202 (for example, 12 to 20 bit data) enter delta sigma converter 204. The sample rate of this data has already been increased from the low clock rate required to code the data to a medium clock rate used to clock the delta sigma converter (interpolation techniques for oversampling data are well understood by experts in this field). The ratio of the low to the medium clock speed is typically 32 (for example, the clock speed might be increased from 16 kHz to 1 MHz). Delta sigma modulator 204 is clocked by medium clock 213 to generate medium resolution data (for example, 2 to 5 bit words). Duty cycle demodulator 208 is clocked by medium clock 213 and high clock 212. The frequency of the high clock is typically a multiple of the medium clock rate (for example, to 16 MHz from 1 MHz). The output of duty cycle demodulator 208 is low resolution data (1 or 2 bit words) at the high clock rate. In this figure, the 0.5 medium clock (clocking at half the rate of the medium clock) is used for alternating output data formats in systems using pulse width modulation. Other systems of this type are described in works by Craven and by Risbo. See, for example, "Toward the 24-bit DAC: Novel Noise-Shaping Topologies Incorporating Correction for the Nonlinearity in a PWM Output Stage" by Peter Craven, J. Audio Eng. Soc., Vol. 41, No. 5, May 1993. See also U.S. Pat. Nos. 5,548,286 and 5,784,017 by Craven. See also WO 97/37433 by L. Risbo et al.

Figure 3:
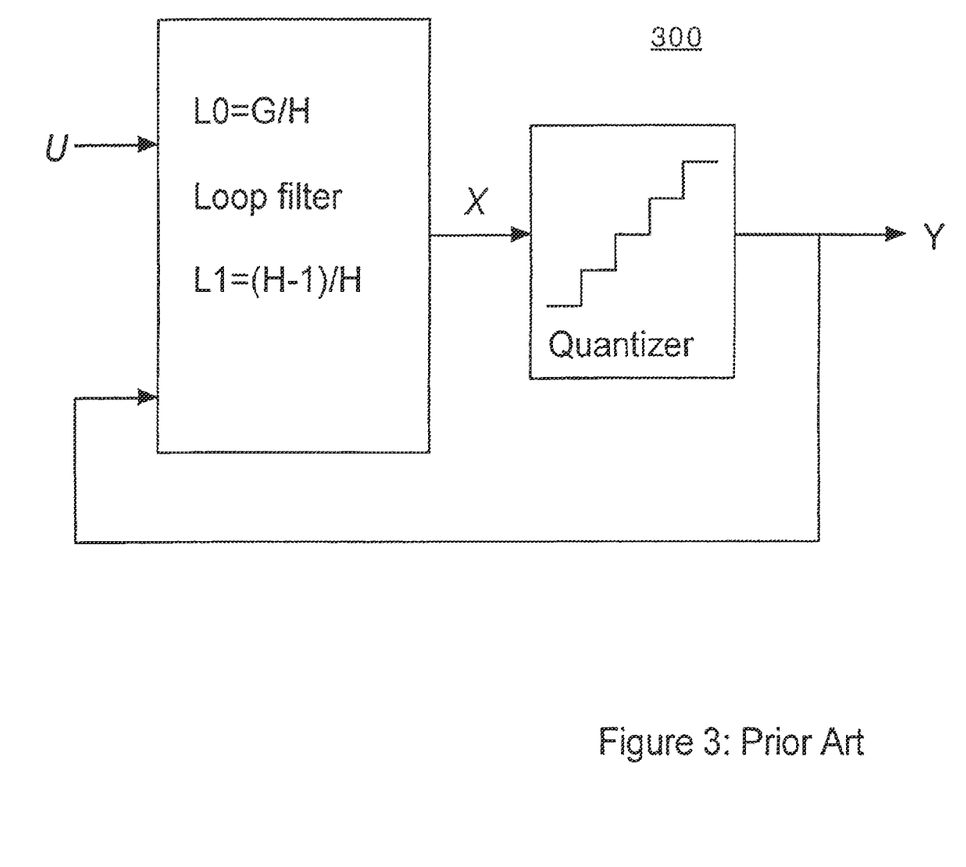
FIG. 3 (Prior Art) is a simplified diagram of a delta sigma noise shaping loop.

Refer now to FIG. 3, showing a generalization of delta sigma noise shaping loops 300. Both of the signals Y and U are assumed to be instantaneously sampled discrete time signals. It is desirable to remove that restriction, and to allow either or both Y and U to be signals with real width, and, potentially, varying shape.

The case where feedback signal Y is a generalized signal allows for the use of PWM techniques, as described above, as well as compensation for imperfect pulse shaping and intersymbol interference. In summary, freeing up the limitations on Y allows for converters that can have arbitrary output waveforms from the final low resolution digital to analog converter. There is a need in the art to develop a systematic approach to the optimization of the feedback and correction coefficients for such a system.

There also remains a need to allow U, the input signal, to be a generalized signal. The case where U is a generalized signal is useful for the conversion of one kind of delta sigma stream into another. An interesting example would be the conversion of a 128 Fs one-bit data stream into a 16-bit Fs six-bit stream. This technique would also be useful in applications requiring sample rate conversion.

Finally, there remains a need for systems in which both signals U and Y are not constrained to be impulse sampled systems. Applications include conversion from a delta sigma format into PWM format, and combinations of sample rate conversion with PWM output.

There is a need in the art to generalize this technique to the case where multiple mutually nonlinear functions (MMNFs) are applied to feedback or feed forward terms before they enter the integrators. Freeing this constraint on higher order delta sigma converter designs can permit the output of arbitrary waveforms from the D/A converter.

Some contemporary solutions require that the nonlinear functions applied to the feedback and feed forward paths be calculated with high accuracy to achieve low distortion. However, higher accuracy is usually associated with higher power and size, which ultimately lead to higher costs. Accordingly, a need exists for a system that reduces the need for high accuracy while still maintaining low distortion.

SUMMARY

A delta sigma converter may be improved to reduce the need for high-accuracy nonlinear function values by configuring the delta sigma converter to set the high-order nonlinear function values to zero when the quantization value being output by the delta sigma converter is at its minimum or maximum value. Because the nonlinear function values go to zero at the limits of the quantization values, less accuracy at these limits is required and cheaper, smaller components may be used to implement these nonlinear functions. According to one embodiment, a delta sigma modulator of at least a second order, operating at an operating clock rate, having an input and producing an output in response to the input, may include at least two state variables; a quantizer having an input responsive to one of the state variables and providing a feedback signal and a modulator output signal; two mutually nonlinear function blocks, each applying a nonlinear function to the feedback from the quantizer, to form two mutually nonlinear feedback signals; and two adders, each adder for adding one of the nonlinear feedback signals to the input of one of the state variables. In some embodiments, the nonlinear functions applied by the function blocks are substantially linear functions when viewed at a clock rate which is a multiple of the operating clock rate. In addition, in some embodiments, at least one of the nonlinear functions applied by the function blocks comprises a zero when the modulator output signal is a maximum modulator output signal capable of being output by the quantizer or when the modulator output signal is a minimum modulator output signal capable of being output by the quantizer.

In some embodiments, the at least one nonlinear function comprising a zero when the modulator output signal is a maximum modulator output signal capable of being output by the quantizer or when the modulator output signal is a minimum modulator output signal capable of being output by the quantizer comprises a quadratic polynomial value. In addition, in other embodiments, the at least one nonlinear function comprising a zero when the modulator output signal is a maximum modulator output signal capable of being output by the quantizer or when the modulator output signal is a minimum modulator output signal capable of being output by the quantizer comprises a cubic polynomial value. According to an embodiment, the at least one nonlinear function comprises a zero value when a pulse corresponding to the minimum modulator output signal has a zero pulse width and a zero value when a pulse corresponding to the maximum output signal has a full pulse width.

According to an embodiment, the nonlinear function blocks comprise read only memories. In addition, in some embodiments, the nonlinear function blocks comprise blocks for generating powers of the feedback from the quantizer and scalar multipliers for implementing polynomials.

According to another embodiment, a method for correcting distortion in a delta sigma modulator of at least second order, having at least two state variables responsive to feedback from an output quantizer and operating at an operating clock rate, includes the steps of determining a system equivalent to the modulator, the system operating at a higher clock rate, the higher clock rate being a multiple of the operating clock rate, wherein the output of the system is substantially linear at the higher clock rate; modeling the response to system operation at the higher clock rate; modelling the correction to be applied to each integrator feedback path at the higher clock rate to correct the modelled distortion; computing the correction to be applied within the modulator at the operating clock rate such that the modulator operating at the operating clock rate substantially matches the operation of the system operating at the higher clock rate in response to the same outputs; and implementing the computed correction by applying at least two mutually nonlinear functions to the feedback from the quantizer, and adding the respective results to at least two state variables, wherein at least one of the at least two nonlinear functions comprises a zero when a modulator output signal is a maximum modulator output signal capable of being output by the quantizer or when the modulator output signal is a minimum modulator output signal capable of being output by the quantizer.

In some embodiments, the at least one nonlinear function comprising a zero when the modulator output signal is a maximum modulator output signal capable of being output by the quantizer or when the modulator output signal is a minimum modulator output signal capable of being output by the quantizer comprises a quadratic polynomial value. In addition, in other embodiments, the at least one nonlinear function comprising a zero when the modulator output signal is a maximum modulator output signal capable of being output by the quantizer or when the modulator output signal is a minimum modulator output signal capable of being output by the quantizer comprises a cubic polynomial value. According to an embodiment, the at least one nonlinear function comprises a zero value when a pulse corresponding to the minimum modulator output signal has a zero pulse width and a zero value when a pulse corresponding to the maximum output signal has a full pulse width.

According to some embodiments, the step of computing the correction includes the steps of determining the roots of the state transition matrix and computing the mutually nonlinear functions based on the roots. In addition, in an embodiment, the step of applying mutually nonlinear functions includes the step of computing powers of the feedback from the quantizer and applying scaling to the powers. Moreover, the step of applying mutually nonlinear functions includes the step of looking up values in look up tables based upon the feedback from the quantizer.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

FIGS. 5, 7, 8, and 9 show examples of higher order delta sigma modulators according to the present invention. Those skilled in the art will appreciate that these figures are merely illustrative examples of higher order delta sigma modulators, and that there are literally infinite ways to combine and interconnect the elements forming higher order delta sigma modulators (e.g. Integrators, feedforward and feedback loops feeding the integrators, scalars, etc.). The methods described in relation to these examples are general, and may be applied to any higher order delta sigma modulator.

A higher order delta sigma modulator according to the present invention is defined as a delta sigma modulator of at least second order, having at least as many state variables as the order of the modulator, with at least two of the state variables responsive to the quantizer on the output of the modulator and at least two of the state variable being modified by mutually nonlinear, nonzero functions. The mutually nonlinear functions are linear when viewed at a clock rate that is a multiple of the operating clock rate.

Figure 4:
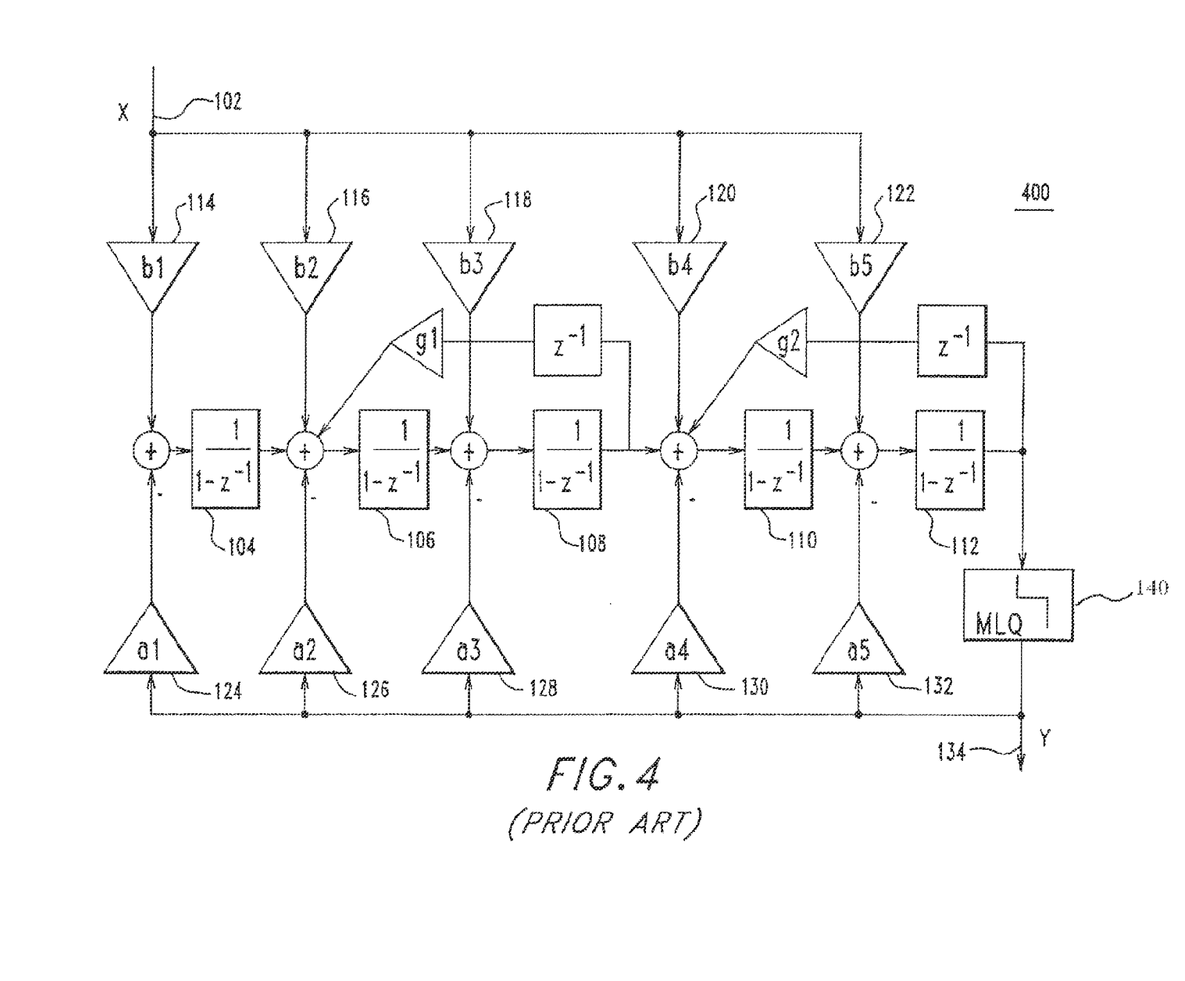
FIG. 4 (Prior Art) shows a fifth-order delta sigma modulator of a well-known type.

FIG. 4 shows a $5^{th}$-order delta sigma modulator 400 of a well-known type. This sort of modulator is known as a feedback structure. The integrators, with transfer function $1/(1-z^{\wedge}(-1))$, are known as "zero delay integrators" since the input will immediately appear at the output. The noise transfer function will have a zero at DC, and complex zero pairs on the unit circle determined by coefficients g1 and g2. The poles of the noise transfer function are set by feedback terms a1, a2, a3, a4, a5. These are normally chosen to produce a Butterworth, or similar, high pass response. Quantizer 140 produces a multilevel output, as would be appropriate for PWM conversion. Input gains b1, b2, b3, b4, and b5 are chosen to determine the in-band frequency response. The text "Delta-sigma Data Converters: Theory, Design and Simulation" provides a good reference for the design of such systems.

Figure 5:
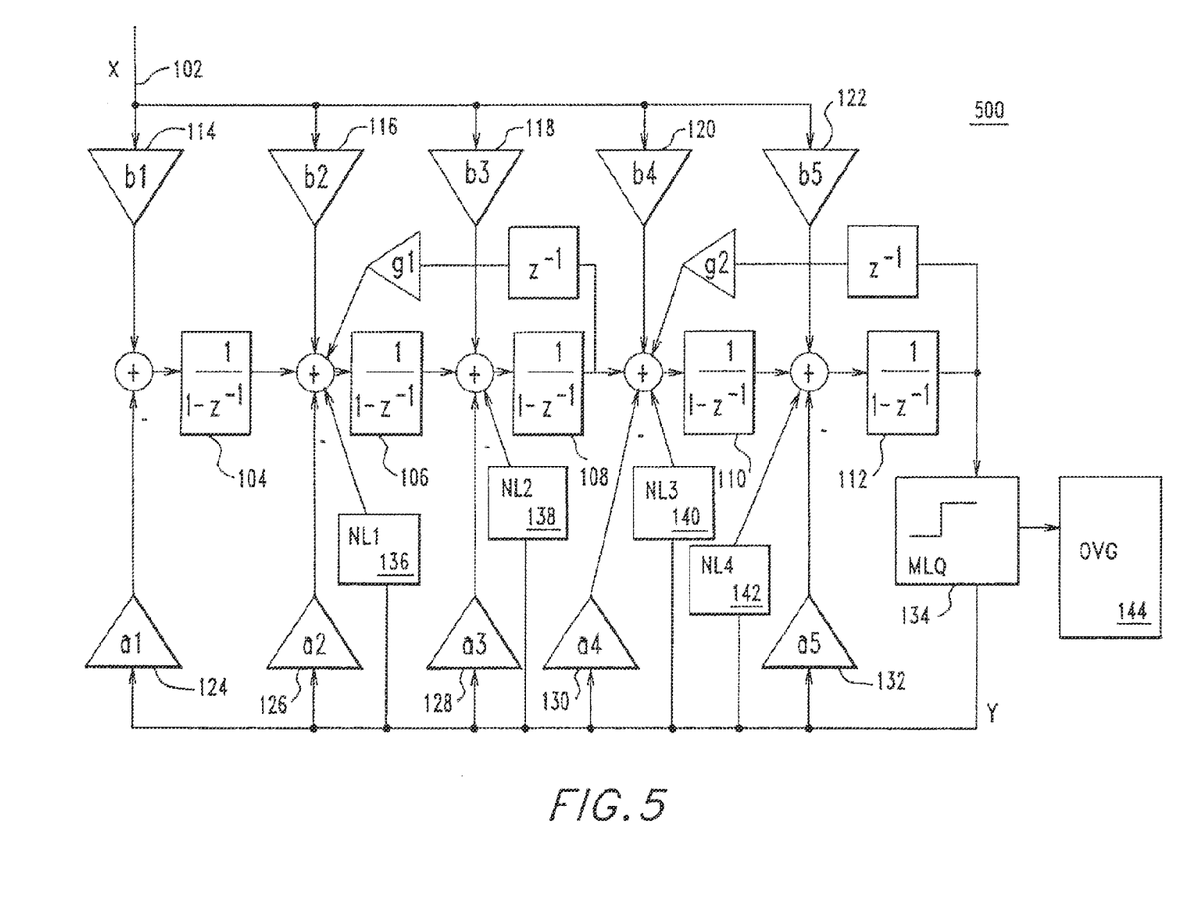
FIG. 5 shows the circuit of FIG. 4 with MMNF elements added to correct for distortion.
Figure 6:
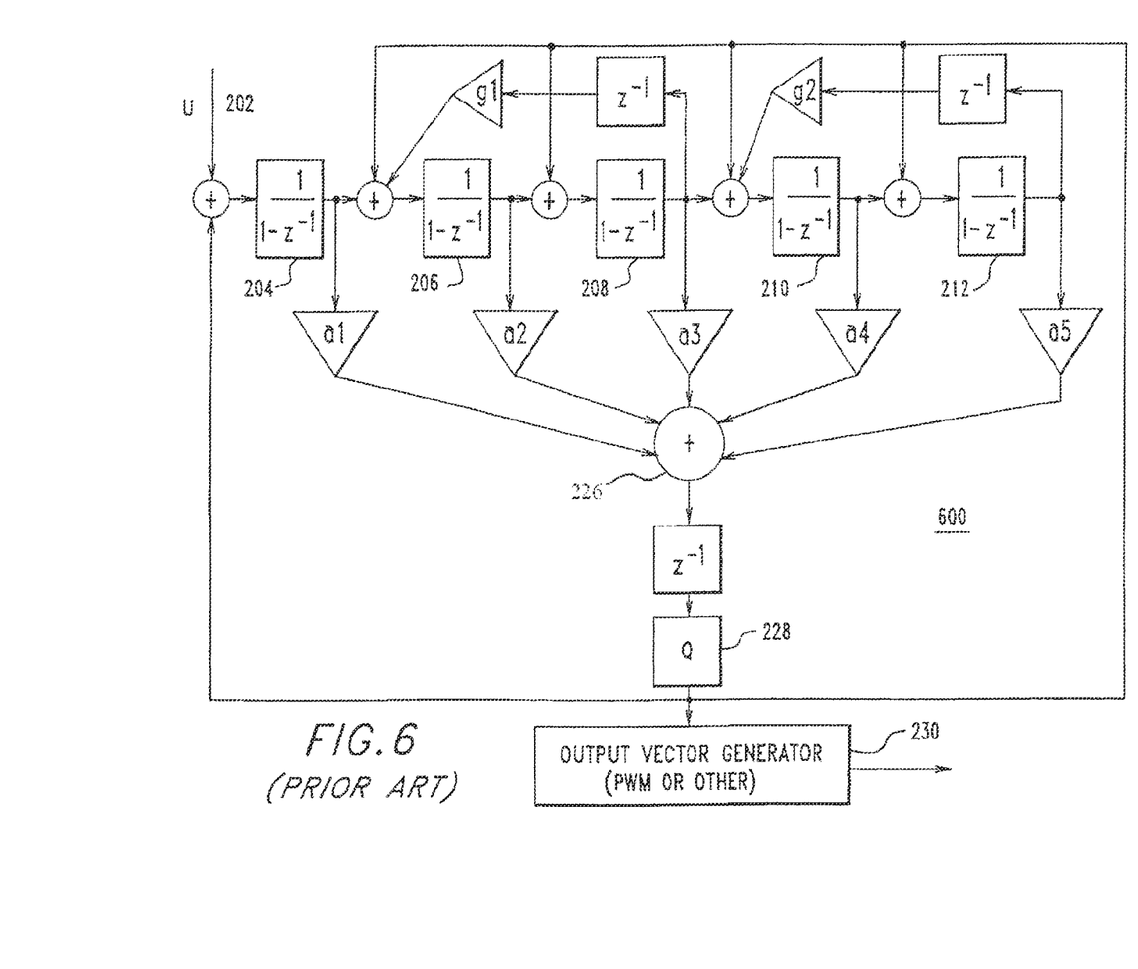
FIG. 6 (Prior Art) shows a feed forward, fifth-order delta sigma modulator of prior art.
Figure 7:
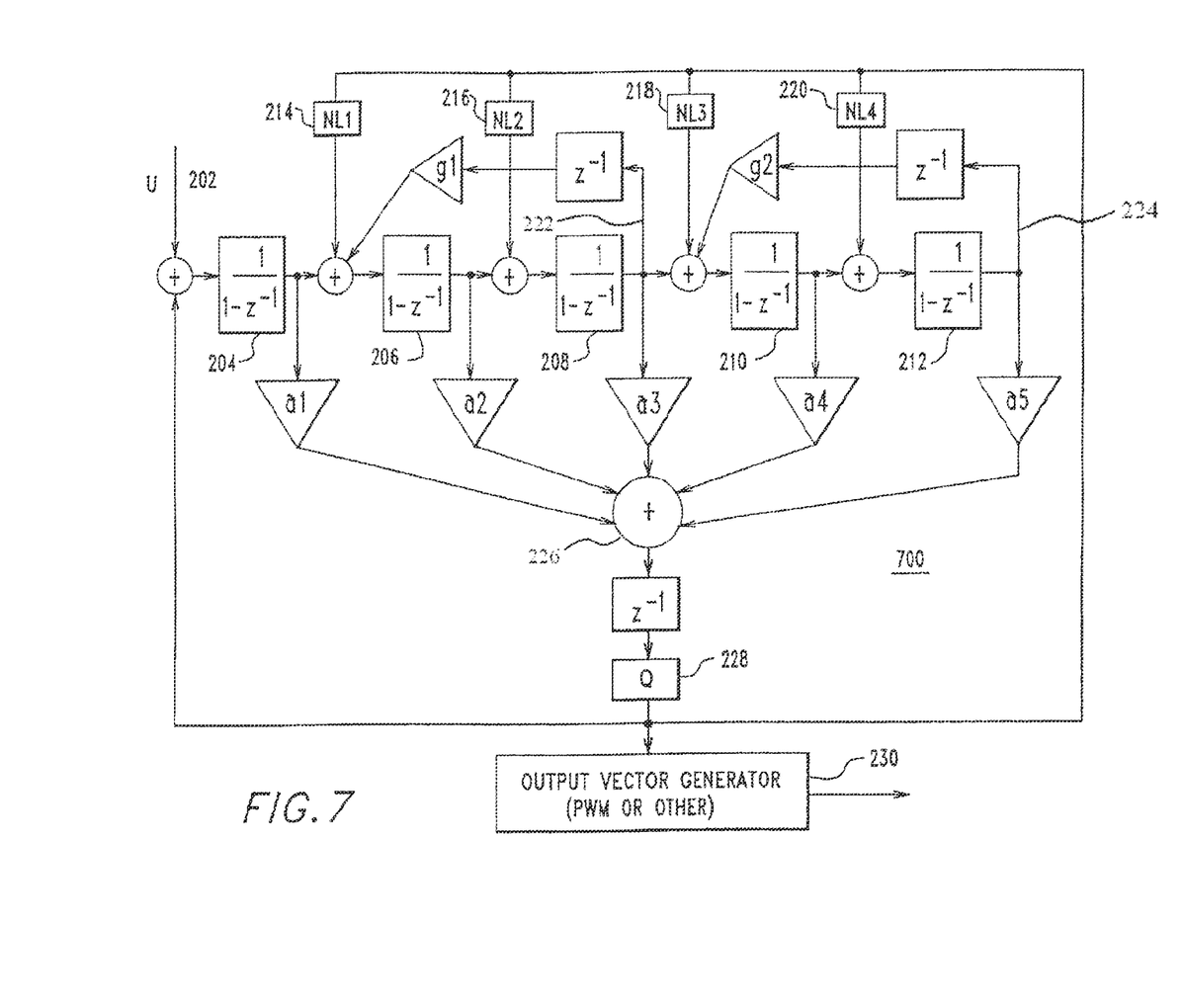
FIG. 7 shows the feed forward delta sigma modulator of FIG. 6 with feedback MMNF correction added.

If such a modulator is combined with a PWM stage, distortion will result. FIG. 5 shows the circuit of FIG. 4 with the multiple mutually nonlinear (MMNL) elements NL1 through NL4 (136 through 142) added to correct for distortion, forming corrected delta sigma modulator 500. The output 144 passes through an output vector generator upon leaving the multilevel quantizer 134. FIG. 6 shows a feed forward, $5^{th}$-order modulator of prior art. FIG. 7 shows a feed forward delta sigma modulator 700 with feedback MMNL correction added. The input signal 202 may be a vector. It enters the delta sigma modulator and passes through integrators 204 through 212. After each integration, the altered data stream is submitted to summation 226. The summed data stream is then passed to quantizer 228.

After the data stream passes through integrators 208 and 212, standard feedback terms 222 and 224 are also fed back into the data stream. After summation and quantization, the quantized output stream is output to a vector generator 230 (for example, to a PWM). It is also subtracted from the input data stream 202, and is fed back after being passed through blocks 214 through 220. At least two of the blocks 214 through 220 are nonlinear functions which are not multiples of each other.

Figure 8:
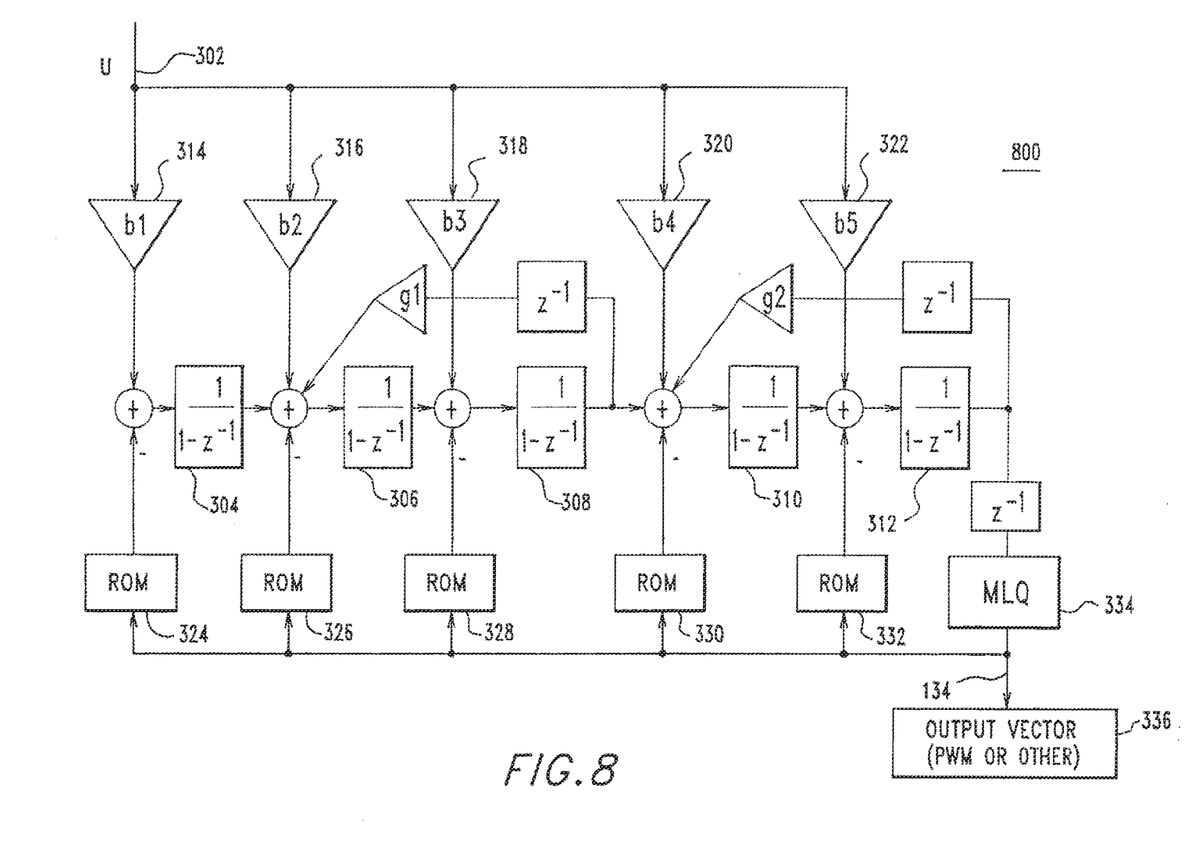
FIG. 8 shows a ROM-based implementation of a system employing a standard feed forward mechanism and MMNF feedback.

FIG. 8 shows a read-only memory (ROM) based implementation of a modulator 800 employing a standard feed forward mechanism and MMNF feedback, implemented through ROMs. This is a convenient way to implement the system of FIG. 5, since the ROM handles both the nonlinear functions and the linear feedback gain. If resonator feedback values g1 and g2 are chosen to be powers of 2, or are sums of a small number of powers of 2, this system can be implemented with table lookups and a few additions.

The key element in the design of any of these systems is the design of the nonlinear feedback terms. In the works of Craven and Risbo, PWM or similar modulation is viewed as an inherently nonlinear process. In both cases, a model is built of the effects of the nonlinearity in the desired output band of the converter. A prediction is made for future effects, and added to the input of the converter. The modeling and prediction are approximations.

However, the effect of PWM is, in fact, linear; it only appears nonlinear because of the choice of sample rate. If viewed at the rate of the medium clock, PWM seems to have an inherently nonlinear nature. This is due only to the chosen frame of reference. If the process is viewed at the high clock rate, or more generally as a continuous time system, the nonlinear effects disappear. This is the basis for the design approach described here: the resulting designs are very general, easily implemented, and perform optimally.

The medium clock rate is defined to be the rate of operation of the noise shaping loop, and is nominally the pattern rate of the PWM output. The high clock rate is that at which the PWM output patterns may be defined, typically an integer multiple of the medium clock rate. The ratio of the clock rates is called the step-up ratio.

The design process, then, has 4 steps:
1. The normal design of a delta sigma noise shaping filter, at the medium clock rate.
2. The transformation of the noise shaping filter to an equivalent one, operating at the higher clock rate.
3. Determining the response of the system to PWM modulation at the high clock rate.
4. Determining the net effect of the response when viewed at the medium clock rate.

The corrections employed as a result of step 4 will be nonlinear, not due to any inherent nonlinear aspect to the modulation, but due to the chosen frame of reference. The noise shaping loop could, at much greater computational expense, be run at the high clock, and there would be no nonlinear behavior in the system. Thus, the nonlinear functions are strictly computational shortcuts, which make implementation easier. There is no approximation involved in this approach, unlike those of Craven and Risbo. In addition, the resulting implementations are very simple.

Figure 9:
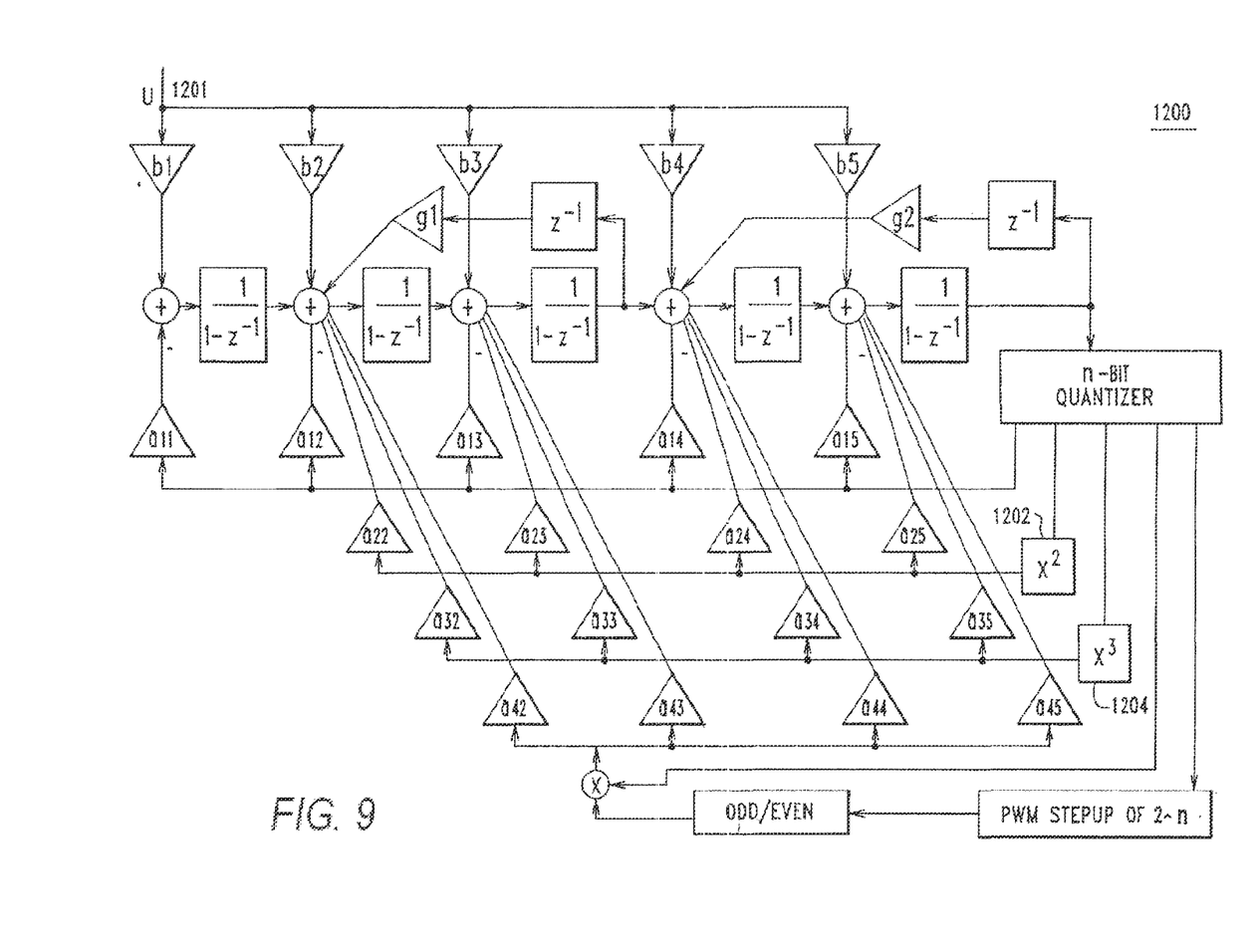
FIG. 9 is an implementation of a fifth-order modulator with real-time calculation of polynomial coefficients.

FIG. 9 shows one implementation 1200 of a $5^{th}$-order modulator with input 1201 where the calculation of the polynomial functions (via blocks 1202 and 1204 for calculating powers of the feedback from the quantizer, and scalars a11-a45 for implementing the polynomials) happens in real time. The use of the polynomial fit has a significant advantage. The MMNFs modify the average gain of the feedback loop, which causes the poles to move and the frequency response to be affected. The mathematical program iteratively modifies the feedback functions, and recalculates the correction factors, so that the transfer function is the same as the original loop when a low level signal is applied. This improvement stage can significantly help for high gain or low oversample ratio stages.

The ability to change step-up ratios on the fly with this technique is useful. If the step-up ratio is randomly chosen and varied among a step-up ratio of 127, 128, and 129, the spectrum of the output signal is spread. This is useful in the design of high powered output stages, where radio frequency emissions may produce problematic interference. In addition, dithering is a significant issue in the design of delta sigma converters: see chapter 3 in the reference "Delta-sigma Data Converters" for a discussion. Switching between step-up ratios helps to dither the quantizer, and the amount of added dither required is cut in half, which improves the SNR. In a related technique, the quantizer can choose the step-up ratio on the fly. For a low level signal, near the middle, the quantization levels are cut in half, which results in a 6 dB improvement in SNR, and a reduction in radio frequency emissions.

The same techniques can be applied to correction of the input elements for the case where they are not simple sampled signals. It could be necessary to convert from a 1-bit stream at 128 Fs to a multiple-bit stream at 16 Fs. Eight input bits would be handled at a time (128/16). The correction would be calculated for each of the 256 8-bit streams, and stored in a table. Alternately, correction terms could be found for each input position, and summed. It has been found to be advantageous to pre-process the bit stream through an Finite Impulse Response (FIR) lowpass filter, and to then apply the correction terms. This pre-process could all be performed by table lookup. In this case, the definition of the MMNF is slightly different. The input is a vector (more than one data point). The elements are summed, scaled, and applied to the first input stage. The value applied to the other stages is not a simple scaling of this term, but is instead a different linear combination of the data in the input vector. This linear combination can be accomplished as a set of vector dot products, input*correct[i], where input is a vector of input samples, and correct[i] is a correction vector which is optimized for each stage. These vectors are not simple linear gains times the unity vector, and therefore they appear nonlinearly determined, but are not.

Related techniques can be used in sample rate conversion applications, where the sample rates are not related by an integer multiple. For sample rate conversion applications, the input stream, at rate fs1, is first oversampled, to (say) rate 256*fs1. These techniques are described in chapter 13 of "Delta Sigma Data Converters." The delta sigma modulator is to be run at fs2, where fs2 is not a simple integral multiple of fs1. The 256*fs1 stream is re-sampled at, say, 16*fs2. If the oversample rates are sufficient, no significant distortion is involved. The final signal is applied to a modulator with the MMNF correction enabled. In effect, the nonlinear functions correct for the time jitter of the input signal, and affect the sample rate conversion, which can be viewed as a time varying shift in the time offset.

The analysis here assumes that the low rate system is designed, converted to an equivalent high rate system, the inputs are applied, and the system is then converted back to the low rate. The final system will then contain MMNFs. Obviously, the feedback and feed forward techniques can be combined. This is the preferred embodiment. Other embodiments could include running the system at the high rate, or designing the original system at the high rate and then converting back to the low rate. These implementations are significantly less desirable.

As the step-up ratio increases, the system may be thought of as a continuous time system. This can be useful in the analysis and correction of digital to analog converters with imperfect outputs, such as non-matching rise and fall times.

In some embodiments, one or more of the MMNL elements NL1 through NL4 illustrated in FIGS. 5 and 7-9 may be set to approximately zero values to reduce the high costs, power, and size associated with calculating high-accuracy values for the nonlinear function elements. For example, high accuracy is typically required when the higher-order MMNL elements, such as MMNL elements NL2 through NL4 illustrated in FIGS. 5 and 7-9, have non-zero nonlinear function values. This requirement is especially true when the values are large because larger values require higher accuracy in order for the system to allow for sufficient frame to frame splicing. Therefore, by setting the values to approximately zero when the values need not be large, the high accuracy limitation may be removed and construction of the illustrated circuits is simplified.

In some embodiments, the times when the higher-order nonlinear function values are set to approximately zero may be a function of the pulse being output by the delta sigma converter. For example, when the pulse being output by the delta sigma converter has a minimum or maximum width, the higher-order nonlinear function values may be set to approximately zero. According to some embodiments, the minimum width of a pulse being output by the delta sigma converter may be a pulse width of approximately zero, and the maximum width of a pulse being output by the delta sigma converter may be a full pulse width.

Figure 10A:
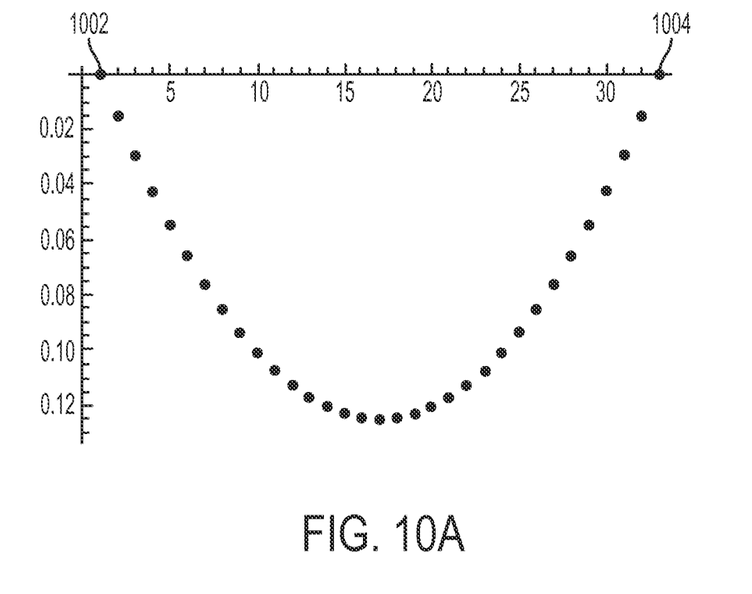
FIGS. 10A and 10B are plots illustrating the values of higher order nonlinear functions as a function of the width of the pulse being output by the delta sigma converter according to an embodiment of the disclosure.
Figure 10B:
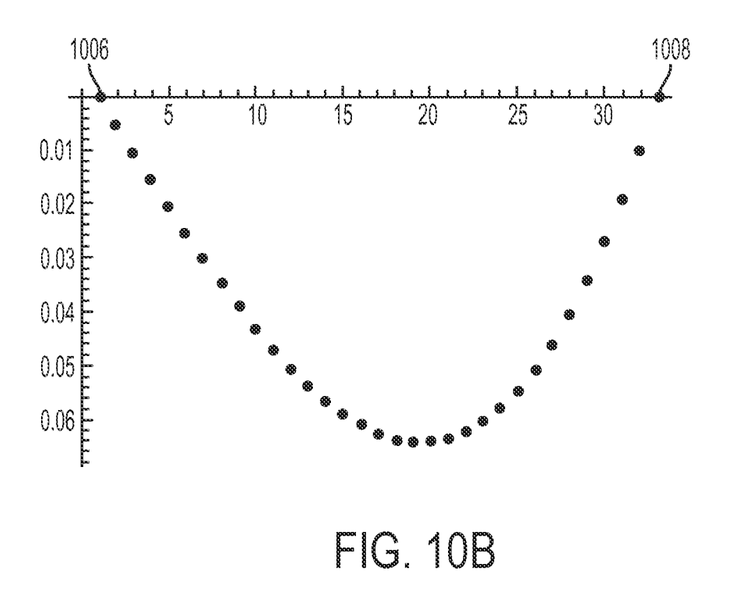

As an illustration, FIGS. 10A and 10B are plots of the values of higher order nonlinear functions as a function of the width of the pulse being output by the delta sigma converter. FIG. 10A is the plot of the values of a second-order polynomial coefficient, and FIG. 10B is the plot of the values of a third-order polynomial coefficient. The values depend on the width of the pulse being output by the delta sigma converter. For example, in FIG. 10A, data point 1002 is the value of the second-order polynomial coefficient when the pulse being output is at its minimum width, such as, for example, a width of approximately zero. Likewise, in FIG. 10B, data point 1006 is the value of the third-order polynomial coefficient when the pulse being output is at its minimum width, such as, for example, a width of approximately zero. The same may be true when the pulse is at its maximum width. For example, in FIG. 10A, data point 1004 is the value of the second-order polynomial coefficient when the pulse being output is at its maximum width, such as, for example, a full pulse width. Likewise, in FIG. 10B, data point 1008 is the value of the third-order polynomial coefficient when the pulse being output is at its maximum width, such as, for example, a full pulse width.

In one embodiment, the pulse having a minimum pulse width may correspond to the quantizer of the delta sigma modulator outputting its minimum modulator output signal. In another embodiment, the pulse having a maximum pulse width may correspond to the quantizer of the delta sigma modulator outputting its maximum modulator output signal. Therefore, in some embodiments, the nonlinear functions applied by nonlinear functional blocks of a delta sigma modulator, such as higher-order functional blocks NL2 through NL4, may be approximately zero when the modulator output signal is a maximum modulator output signal capable of being output by the quantizer. Alternatively or additionally, the blocks NL2 through NL4 may be approximately zero when the modulator output signal is a minimum modulator output signal capable of being output by the quantizer.

According to one embodiment, the nonlinear function set to approximately zero when the modulator output signal is a maximum modulator output signal capable of being output by the quantizer or when the modulator output signal is a minimum modulator output signal capable of being output by the quantizer may be a quadratic polynomial value, such as a value to be applied by nonlinear functional block NL2. According to another embodiment, the nonlinear function set to approximately zero when the modulator output signal is a maximum modulator output signal capable of being output by the quantizer or when the modulator output signal is a minimum modulator output signal capable of being output by the quantizer may be a cubic polynomial value, such as a value to be applied by nonlinear functional block NL3. In general, according to some embodiments, any value to be applied by the higher-order nonlinear functional elements, such as nonlinear functional elements NL2 to NLN, may be set to approximately zero when the modulator output signal is a maximum modulator output signal capable of being output by the quantizer or when the modulator output signal is a minimum modulator output signal capable of being output.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A delta sigma modulator of at least second order, operating at an operating clock rate, having an input and producing an output in response to the input, comprising:
   at least two state variables;
   a quantizer having an input responsive to one of the state variables and providing a feedback signal and a modulator output signal;
   a function block configured to apply nonlinear functions to the feedback from the quantizer to form two mutually nonlinear feedback signals; and
   an adder block configured to add one of the nonlinear feedback signals to the input of one of the state variables,
   wherein the nonlinear functions applied by the function blocks are substantially linear functions when viewed at a clock rate which is a multiple of the operating clock rate, and
   wherein at least one of the nonlinear functions applied by the function block comprises approximately zero when the modulator output signal is a maximum modulator output signal capable of being output by the quantizer or when the modulator output signal is a minimum modulator output signal capable of being output by the quantizer.

2. The modulator of claim 1, wherein the at least one nonlinear function comprising approximately zero when the modulator output signal is a maximum modulator output signal capable of being output by the quantizer or when the modulator output signal is a minimum modulator output signal capable of being output by the quantizer comprises a quadratic polynomial value.

3. The modulator of claim 1, wherein the at least one nonlinear function comprising approximately zero when the modulator output signal is a maximum modulator output signal capable of being output by the quantizer or when the modulator output signal is a minimum modulator output signal capable of being output by the quantizer comprises a cubic polynomial value.

4. The modulator of claim 1, wherein the at least one nonlinear function comprises approximately zero value when a pulse corresponding to the minimum modulator output signal has a zero pulse width and a zero value when a pulse corresponding to the maximum output signal has a full pulse width.

5. The modulator of claim 1, wherein the nonlinear function blocks comprise read only memories (ROMs).

6. The modulator of claim 1, wherein the nonlinear function blocks comprise blocks for generating powers of the feedback from the quantizer and scalar multipliers for implementing polynomials.

7. A method for correcting distortion in a delta sigma modulator of at least second order, having at least two state variables responsive to feedback from an output quantizer and operating at an operating clock rate, comprising the steps of:
   determining a system equivalent to the modulator, the system operating at a higher clock rate, the higher clock rate being a multiple of the operating clock rate, wherein the output of the system is substantially linear at the higher clock rate;
   modeling the response to a system operation at the higher clock rate;
   modeling a correction to be applied to each integrator feedback path at the higher clock rate to correct the modelled distortion;
   computing the correction to be applied within the modulator at the operating clock rate such that the modulator operating at the operating clock rate substantially matches the operation of the system operating at the higher clock rate in response to the same outputs; and
   implementing the computed correction by applying at least two mutually nonlinear functions to the feedback from the quantizer, and adding the respective results to at least two state variables, wherein at least one of the at least two nonlinear functions comprises approximately zero when a modulator output signal is a maximum modulator output signal capable of being output by the quantizer or when the modulator output signal is a minimum modulator output signal capable of being output by the quantizer.

8. The method of claim 7, wherein the at least one nonlinear function comprising approximately zero when the modulator output signal is a maximum modulator output signal capable of being output by the quantizer or when the modulator output signal is a minimum modulator output signal capable of being output by the quantizer comprises a quadratic polynomial value.

9. The method of claim 7, wherein the at least one nonlinear function comprising approximately zero when the modulator output signal is a maximum modulator output signal capable of being output by the quantizer or when the modulator output signal is a minimum modulator output signal capable of being output by the quantizer comprises a cubic polynomial value.

10. The method of claim 7, wherein the at least one nonlinear function comprises approximately zero value when a pulse corresponding to the minimum modulator output signal has a zero pulse width and a zero value when a pulse corresponding to the maximum output signal has a full pulse width.

11. The method of claim 7, wherein the step of computing the correction includes the steps of determining roots of a state transition matrix and computing the mutually nonlinear functions based on the roots.

12. The method of claim 7, wherein the step of applying mutually nonlinear functions includes the step of computing powers of the feedback from the quantizer and applying scaling to the powers.

13. The method of claim 7, wherein the step of applying mutually nonlinear functions includes the step of looking up values in look up tables based upon the feedback from the quantizer.

\* \* \* \* \*